(12) United States Patent
Kozakai et al.

(10) Patent No.: US 7,542,355 B2
(45) Date of Patent: Jun. 2, 2009

(54) SEMICONDUCTOR STORAGE DEVICE

(75) Inventors: Kenji Kozakai, Tokyo (JP); Tsutomu Nakajima, Tokyo (JP); Koji Sakui, Tokyo (JP)

(73) Assignee: Sony Corporation (JP)

( * ) Notice: Subject to any disclaimer, the term of this patent is extended or adjusted under 35 U.S.C. 154(b) by 120 days.

(21) Appl. No.: 11/902,721

(22) Filed: Sep. 25, 2007

(65) Prior Publication Data

US 2008/0084742 A1 Apr. 10, 2008

(30) Foreign Application Priority Data

Oct. 6, 2006 (JP) ............................. 2006-275096

(51) Int. Cl.
*G11C 7/10* (2006.01)
(52) U.S. Cl. ............................. 365/189.05; 365/189.06; 365/230.08; 365/230.11; 365/230.12
(58) Field of Classification Search ............ 365/189.05, 365/189.06, 230.08, 233.11, 233.12
See application file for complete search history.

(56) References Cited

U.S. PATENT DOCUMENTS 5,996,043 A 11/1999 Manning 6,839,261 B2* 1/2005 Higuchi ........................ 365/51
7,085,152 B2* 8/2006 Ellis et al. .................... 365/149

FOREIGN PATENT DOCUMENTS

| JP | 05-282882 | 10/1993 |
|----|-----------|---------|
| JP | 07-230688 | 8/1995 |
| JP | 2000-285674 | 10/2000 |
| JP | 2001-028190 | 1/2001 |
| JP | 2002-505786 | 2/2002 |
| JP | 2005-182996 | 7/2005 |

OTHER PUBLICATIONS

Japanese Office Action issued Sep. 16, 2008 for corresponding Japanese Application No. 2006-275096.

* cited by examiner

*Primary Examiner*—Pho M. Luu
(74) *Attorney, Agent, or Firm*—Rader Fishman & Grauer PLLC; Ronald P. Kananen

(57) ABSTRACT

Disclosed herein is a semiconductor storage device including: a memory core having memory cells to be accessed; and an interface circuit having terminals operable to input and output a chip enable signal adapted to select a chip, at least one control signal adapted to control the chip operation, a clock signal adapted to control the chip I/O operation timing and a series of data including a command, address and data; wherein the interface circuit includes at least one input holding unit adapted to hold the control signal, and the interface circuit processes the control signal after loading it temporarily into the first input holding unit.

24 Claims, 10 Drawing Sheets

MEMORY CELL MC          SELECT TRANSISTOR ST

SEMICONDUCTOR STORAGE DEVICE

CROSS REFERENCES TO RELATED APPLICATIONS

The present invention contains subject matter related to Japanese Patent Application JP 2006-275096 filed in the Japan Patent Office on Oct. 6, 2006, the entire contents of which being incorporated herein by reference.

BACKGROUND OF THE INVENTION

1. Field of the Invention

The present invention relates to a semiconductor storage device such as NAND-type EEPROM and particularly to an improvement of an interface for processing control signals, adapted to control a memory core including a memory cell array, a command, address and data.

2. Description of the Related Art

FIGS. 1A to 1F are views illustrating input waveforms during a write operation to an ordinary NAND-type flash memory having an asynchronous interface.

FIG. 1A illustrates a chip enable signal CEB (negative logic). FIG. 1B illustrates a write enable signal WEB (negative logic). FIG. 1C illustrates a command latch enable signal CLE (positive logic). FIG. 1D illustrates an address latch enable signal ALE (positive logic). FIG. 1E illustrates a read enable signal REB (negative logic). FIG. 1F illustrates an I/O status.

In the example illustrated in FIGS. 1A to 1F, the chip enable signal CEB (negative logic) is pulled down to low level to select the chip.

In cycle 1, the write enable signal WEB (negative logic), adapted to select input operation, is pulled down to low level. Further, the command latch enable signal CLE (positive logic), adapted to select command input, is pulled up to high level. Still further, the address latch enable signal ALE (positive logic), adapted to select address input, is pulled down to low level.

When the write enable signal WEB switches from low level back to high level, the chip loads, as a command, a code input from I/O adapted to input a command or address, and adapted to input and output data.

In cycle 2, the command latch enable signal CLE is pulled down to low level. Further, the address latch enable signal ALE is pulled up to high level. As a result, when the write enable signal WEB switches from low level back to high level, the chip loads a code input from the I/O as an address. In this example, cycles 2 to 6 are address inputs.

In cycle 7, the command latch enable signal CLE is pulled down to low level. Further, the address latch enable signal ALE is pulled down to low level. As a result, the chip loads a code input from the I/O as data.

In cycle n, the command latch enable signal CLE is pulled up to high level. Further, the address latch enable signal ALE is pulled down to low level. As a result, the chip loads a code input from the I/O as a command. This initiates the write process in the chip.

In this example, the read enable signal REB (negative logic), adapted to select output operation, remains at high level, which keeps the signal REB inactive.

FIG. 2 is a block diagram illustrating a configuration example of an ordinary NAND-type flash memory having an asynchronous interface which can implement the example in FIG. 1.

A NAND-type flash memory 1 in FIG. 2 includes an interface circuit 2, a command decoder/command latch 3, a low address latch 4, a column address latch 5, a control logic circuit 6, a page buffer 7 and a memory core 8 which includes a memory cell array having NAND-type memory cells arranged in an array form.

The interface circuit 2 includes input buffers 21 to 26, an output buffer 27 and terminals T21 to T26.

The terminal T21 is an input terminal (pin) for the write enable signal WEB. The terminal T22 is an input terminal (pin) for the address latch enable signal ALE. The terminal T23 is an input terminal (pin) for the command latch enable signal CLE. The terminal T24 is an input terminal (pin) for the read enable signal REB. The terminal T25 is a data I/O terminal (input/output pin). The terminal T26 is an input terminal (pin) for the chip enable signal CEB.

In FIG. 2, the input terminal T26 for the chip enable signal CEB is connected to the input buffer 26. The input buffer 26 is typically active.

As the chip enable signal CEB, which is a chip select signal, goes low, the input buffers 21 and 24 change from inactive to active status. The input buffer 21 is connected to the terminal T21 for the write enable signal WEB, and the input buffer 24 to the terminal T24 for the read enable signal REB.

In the example of FIG. 1, as the write enable signal WEB, which is an input select signal, goes low next, the input buffers 23, 22 and 25 change from inactive to active status. The input buffer 23 is connected to the terminal T23 for the command latch enable signal CLE. The input buffer 22 is connected to the terminal T22 for the address latch enable signal ALE. The input buffer 25 is connected to the data input/output (I/O) terminal T25.

On the other hand, the read enable signal REB fed to the terminal T24 remains at high level. As a result, the output buffer 27 connected to the I/O remains inactive.

As the input buffers 23 and 22 are activated, the command latch enable signal CLE, the address latch enable signal ALE and the code from the I/O terminal T25 are input and decoded by the command decoder 3. The code is accepted at the leading edge of the write enable signal WEB. If the code is a command, it is loaded into the command latch 3. If the code is an address, it is loaded into the address latch 4 or 5. On the other hand, if the code is data, it is transferred to the page buffer 7.

An ordinary NAND-type flash memory having an asynchronous interface is relatively slow in operation. Thus, the above operation is completed within a cycle.

Incidentally, NAND-type flash memories have peripheral circuitry transistors constructed in the same manner as their memory cell. Peripheral transistors are fabricated simultaneously when the memory cell is formed, thus keeping down the costs.

FIG. 3 illustrates a sectional view of peripheral transistors. These transistors differ from the memory cell in that a floating gate FG and a control gate CG are connected together via a contact CNT.

Therefore, the gate oxide film thickness of peripheral transistors is determined by the memory cell film thickness. Further, the gate oxide film thickness of the memory cell is physically determined by the retention characteristics of the memory cell and limited to about 8 to 9 nm. For this reason, the gate oxide film thickness of peripheral transistors is also limited to 8 to 9 nm despite advancement of the process generations.

SUMMARY OF THE INVENTION

Because of the reasons described above, the transistor performance has not shown any improvement.

Under such circumstances, asynchronous interface is acceptable for low-speed operation. However, switching to a synchronous interface for higher communication speed between chips will make it hard to complete the processing from command input to decoding within one cycle due to poor transistor performance.

It is desirable to provide a semiconductor storage device capable of high-speed operation to complete the processing from command input to decoding within a desired cycle without any improvement in transistor performance.

A semiconductor storage device of a first embodiment of the present invention includes a memory core having memory cells to be accessed. The semiconductor storage device also includes an interface circuit having terminals operable to input and output signals and data. Such signals and data include a chip enable signal adapted to select a chip, at least one control signal adapted to control the chip operation, a clock signal adapted to control the chip I/O operation timing and a series of data including a command, address and data. The interface circuit has at least one first input holding unit adapted to hold the control signal. The interface circuit processes the control signal after loading it temporarily into the first input holding unit.

Preferably, the interface circuit has a second input holding unit adapted to hold a series of data including a command, address and data. The interface circuit loads the control signal into the first input holding unit in synchronism with the clock signal. The interface circuit loads the series of data into the second input holding unit in synchronism with the clock signal.

Preferably, the first input holding unit includes at least one first input buffer and at least one first input latch. The first input buffer is adapted to be activated by the chip enable signal and load the control signal. The first input latch is adapted to latch the control signal, loaded into the first input buffer, in synchronism with the clock signal. The second input holding unit includes at least one second input buffer and at least one second input latch. The second input buffer is adapted to be activated by the chip enable signal and load the series of data. The second input latch is adapted to latch the series of data, loaded into the second input buffer, in synchronism with the clock signal.

Preferably, the semiconductor storage device includes at least one first selection/holding circuit and at least one second selection/holding circuit. The first selection/holding circuit selects and holds the control signal, latched by the first input latch, for a plurality of clocks of the clock signal. Further, the circuit outputs the control signal in a parallel manner after classifying the signal into a plurality of signal groups. The second selection/holding circuit selects and holds the series of data, latched by the second input latch, for a plurality of clocks of the clock signal. Further, the circuit outputs the series of data in a parallel manner after classifying the series of data into a plurality of signal groups.

Preferably, the semiconductor storage device includes a third input buffer adapted to be activated by the chip enable signal and load the clock signal. The first and second input latches latch the control signal and the series of data in synchronism with the clock signal temporarily loaded into the third input buffer.

Preferably, the semiconductor storage device includes an n-bit counter capable of counting the clock signal held by the third input buffer for n bits of the series of data. At least one of the first and second selection/holding circuits selects and holds the control signal and the series of data for a plurality of clocks of the clock signal. At least one of the first and second selection/holding circuits does so based on a count value of the n-bit counter and in synchronism with the clock signal held by the third input buffer. Further, the circuit outputs the control signal and the series of data in a parallel manner after classifying the signal and the data into a plurality of signal groups.

Preferably, the semiconductor storage device includes a multi-port command decoder adapted to receive a plurality of sets of output values from the first and second selection/holding circuits and determine the operation of and input data to the memory core.

Preferably, the semiconductor storage device includes a multi-port command decoder adapted to receive a plurality of sets of output values from the first and second selection/holding circuits and determine the operation of and input data to the memory core.

Preferably, the control signal is at least one of a command latch enable signal adapted to load a command into the chip, an address latch enable signal adapted to load an address thereinto and a write enable signal adapted to load data thereinto.

A nonvolatile semiconductor storage device of a second embodiment of the present invention includes a memory core having memory cells to be accessed. The nonvolatile semiconductor storage device also includes an interface circuit having terminals adapted to input and output signals and data. Such signals and data include a chip enable signal adapted to select a chip, at least one control signal adapted to control the chip operation, a clock signal adapted to control the chip I/O operation timing and a series of data including command, address and data. The memory core includes a memory cell array having rewritable nonvolatile memory cells arranged in an array form. The memory core further includes means for selecting a word line of the memory cell array. The memory core still further includes means for selecting a bit line of the memory cell array. The memory core still further includes a circuit with latch function which is connected to the bit lines of the memory cell array. The interface circuit loads the control signal as logic data "1" or "0", as it does the data, into the nonvolatile semiconductor storage device provided in the chip in synchronism with the clock signal.

A nonvolatile semiconductor storage device of a third embodiment of the present invention includes a memory core having memory cells to be accessed. The nonvolatile semiconductor storage device also includes an interface circuit adapted to receive signals and data. Such signals include a chip enable signal adapted to select the nonvolatile semiconductor storage device, a clock signal adapted to control the chip I/O operation timing, a command latch enable signal adapted to load a command into the nonvolatile semiconductor storage device, an address latch enable signal adapted to load an address thereinto and a write enable signal adapted to load data thereinto. The memory core includes a memory cell array. The memory cell array includes NAND-type memory cell units arranged in an array form. Each of the memory cell units includes a memory cell column having N rewritable nonvolatile memory cells connected in series with each other. Each of the memory cell units further includes a bit line side select gate which is connected in series between the memory cell column and a bit line. Each of the memory cell units still further includes a source-side select gate which is connected in series between the memory cell column and a source line. The memory core further includes means for selecting a word line of the memory cell array and means for selecting a bit line of the memory cell array. The memory core still further includes a circuit with latch function which is connected to the bit lines of the memory cell array. The interface circuit loads the command latch enable, address latch enable and write enable signals as logic data "1" or "0", as it does the data, into input buffers provided in the nonvolatile semiconductor storage device in synchronism with the clock signal.

A rewritable nonvolatile semiconductor storage device of a fourth embodiment of the present invention includes an interface circuit and a decoder. The interface circuit receives a chip enable signal adapted to select the nonvolatile semiconductor storage device, a clock signal adapted to control the I/O operation timing of the nonvolatile semiconductor storage device, and at least one control signal adapted to load a command or write data into the nonvolatile semiconductor storage device. The interface circuit loads the at least one control signal in synchronism with the clock signal, as a plurality of sets of logic data of "1" or "0", into the nonvolatile semiconductor storage device. The decoder decodes the plurality of sets of logic data and determines, based on the decoding result, the operation of and input data to the nonvolatile semiconductor storage device.

According to an embodiment of the present invention, the interface circuit performs given processing on a control signal after loading it into a first input holding unit.

According to an embodiment of the present invention, the processing from command input to decoding can be completed within a desired cycle, thus allowing high-speed processing.

DETAILED DESCRIPTION OF THE PREFERRED EMBODIMENTS

The preferred embodiments of the present invention will be described below with reference to the accompanying drawings.

Figure 1:
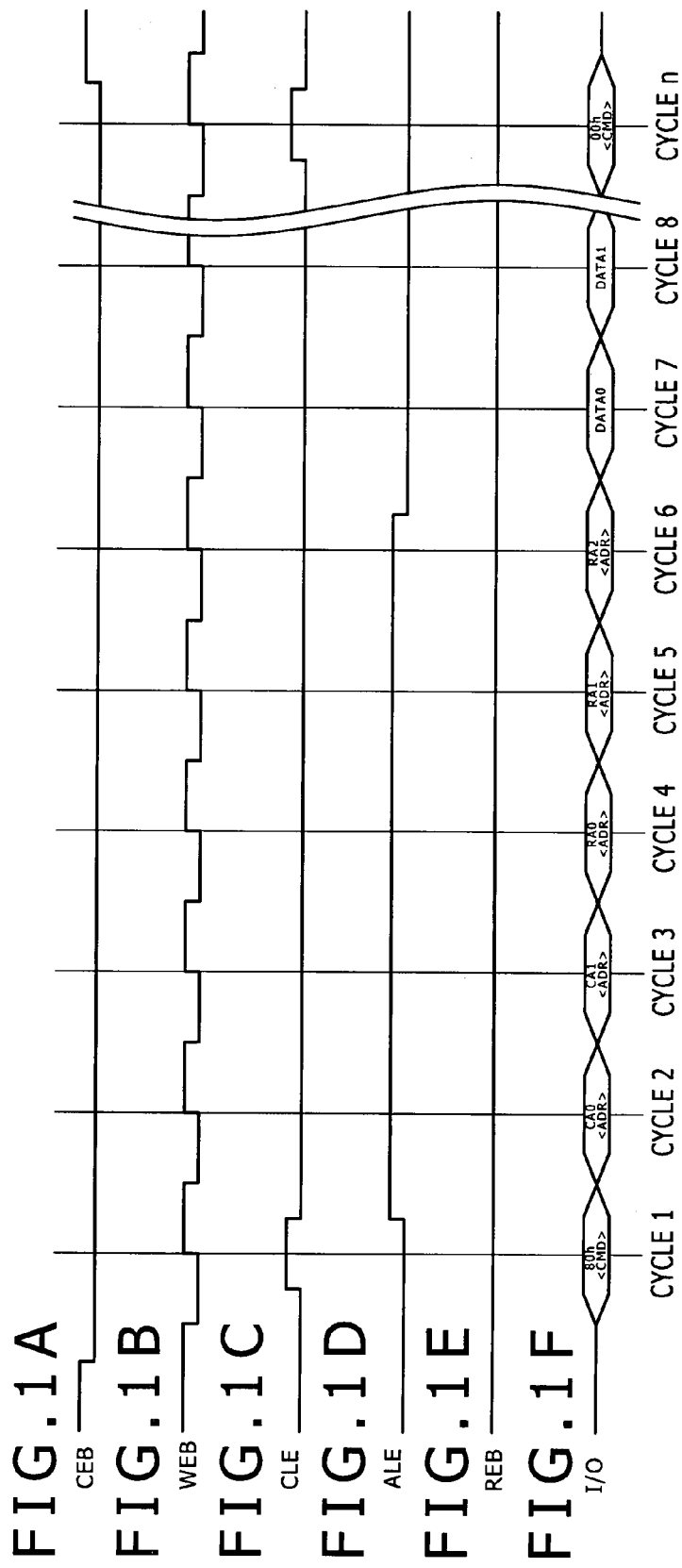
FIGS. 1A to 1F are views illustrating input waveforms during a write operation to an ordinary NAND-type flash memory having an asynchronous interface.
Figure 2:
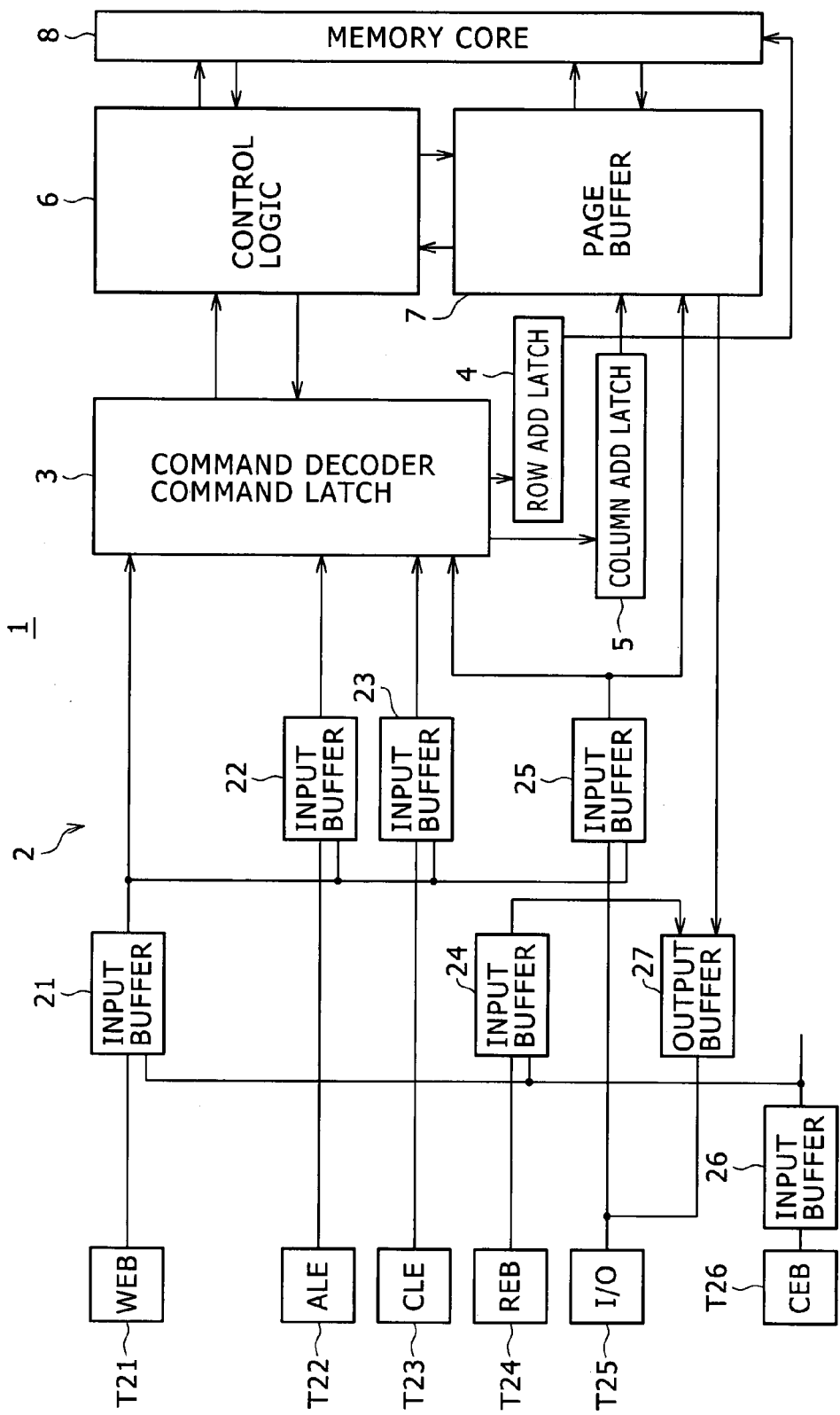
FIG. 2 is a block diagram illustrating a configuration example of an ordinary NAND-type flash memory having an asynchronous interface which can implement the example in FIG. 1.
Figure 3:
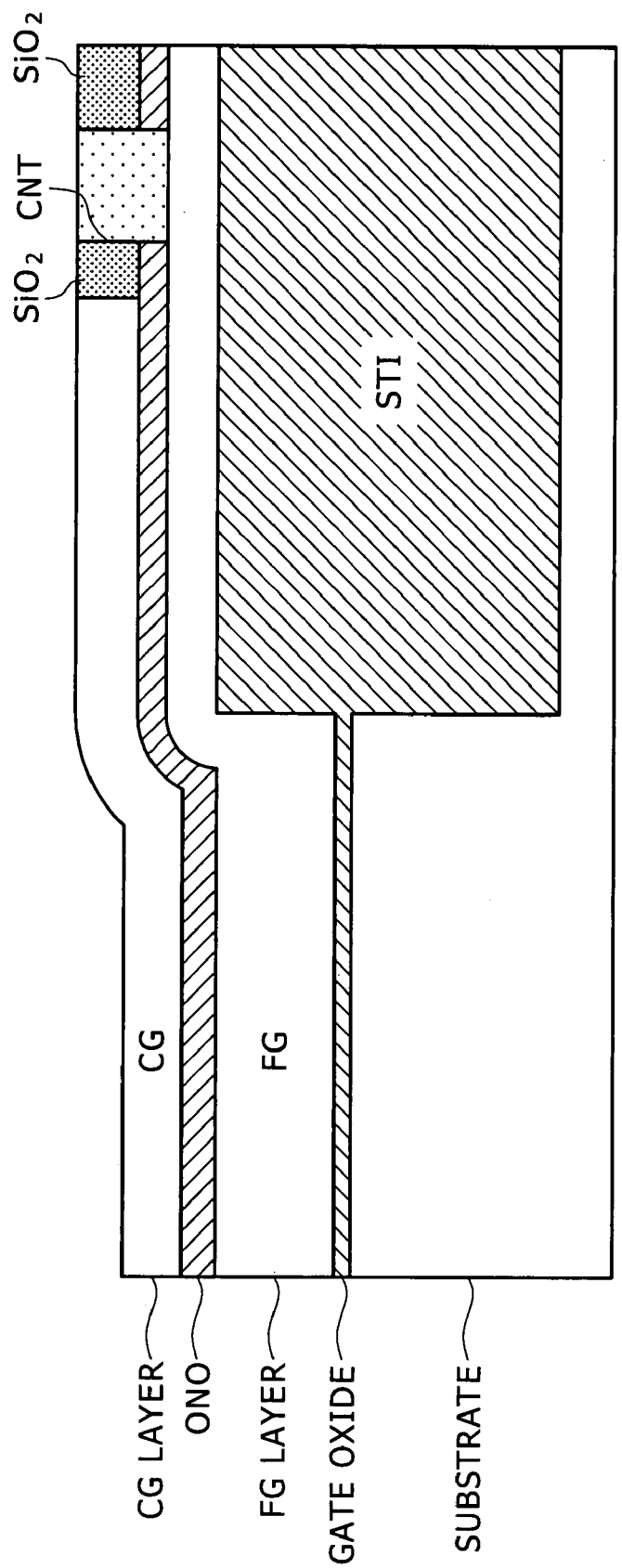
FIG. 3 is a sectional view of peripheral transistors.
Figure 4:
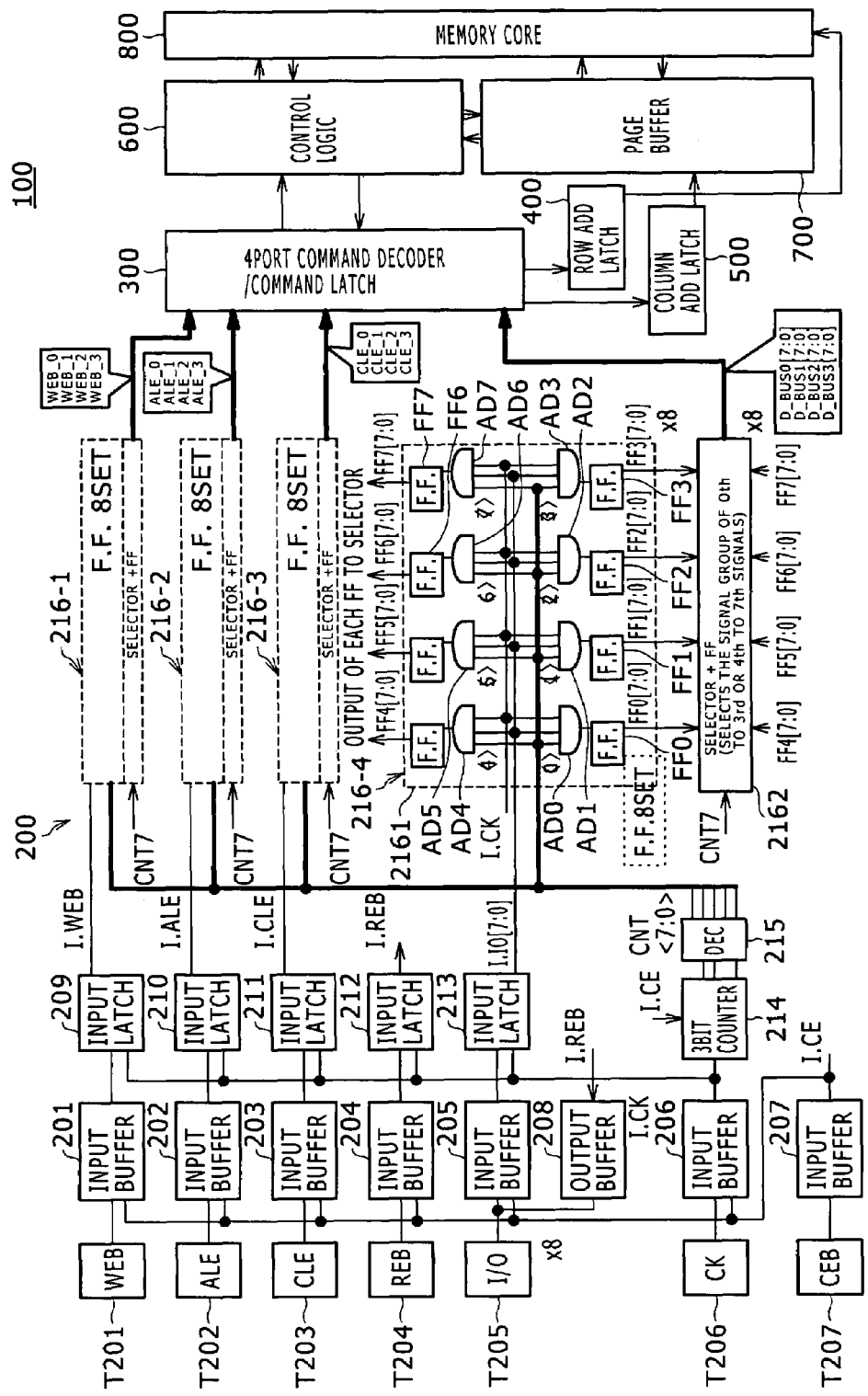
FIG. 4 is a block diagram illustrating a configuration example of a NAND-type EEPROM (flash memory) which is a nonvolatile semiconductor storage device according to an embodiment of the present invention.

FIG. 4 is a block diagram illustrating a configuration example of a NAND-type EEPROM (flash memory) which is a nonvolatile semiconductor storage device according to an embodiment of the present invention.

In the present embodiment, a NAND-type flash memory 100 has a high-speed synchronous interface circuit in synchronism with a clock signal CK.

In the present embodiment, a control signal is loaded into the NAND-type flash memory 100, as with data, as one or a plurality of sets of logic data of "1" or "0" in synchronism with the clock signal CK. In other words, command data and write data are sequentially fed into the NAND-type flash memory 100 concurrently and in parallel with the control signal in synchronism with the clock signal CK.

Here, the control signal includes at least one of the command latch enable signal CLE adapted to load a command into the NAND-type flash memory 100, the address latch enable signal ALE adapted to load an address thereinto and the write enable signal WEB adapted to load data thereinto.

As for the control signal loaded into the NAND-type flash memory 100 in synchronism with the clock signal CK, the number of sets of logic data of "1" or "0" making up the control signal is equal to two raised to a power.

The control signal is loaded into the NAND-type flash memory 100 as a plurality of sets of logic data of "1" or "0". Logic data, the number of whose sets is equal to two raised to a power, is decoded by a command decoding circuit. Based on the resultant value, the operation of and input data to the NAND-type flash memory 100 are determined.

The configuration and functions of the NAND-type flash memory (chip) 100 according to the present embodiment will be described more specifically.

As illustrated in FIG. 4, the NAND-type flash memory (chip) 100 includes an interface circuit 200, a four-port command decoder/command latch 300, a row address latch 400, a column address latch 500, a control logic circuit 600, a page buffer 700 and a memory core 800. The memory core 800 includes a memory cell array having NAND-type memory cells arranged in an array form.

The interface circuit 200 includes input buffers 201 to 207, an output buffer 208, input latches 209 to 213, an n-bit counter (three-bit counter in the present embodiment) 214, a decoder 215, selection/holding circuits 216-1 to 216-4 and terminals T201 to T207.

The input buffers 201 to 204 make up first buffers for control signals. The input buffer 205 makes up a second buffer for a series of data including command, address and data. The input buffer 206 makes up a third buffer for clock signal.

The input latches 209 to 212 make up first latches. The input latch 213 makes up a second latch for a series of data.

Four pairs of an input buffer and an input latch, namely, the input buffer 201 and the input latch 209, the input buffer 202 and the input latch 210, the input buffer 203 and the input latch 211, and the input buffer 204 and the input latch 212, make up first input holding units adapted to hold a control signal.

The input buffer 205 and the input latch 213 make up a second input holding unit adapted to hold a series of data.

The terminal T201 is an input terminal (pin) for the write enable signal WEB (negative logic) adapted to load data. The terminal T202 is an input terminal (pin) for the address latch enable signal ALE (positive logic) adapted to load an address. The terminal T203 is an input terminal (pin) for the command latch enable signal CLE (positive logic) adapted to load a command. The terminal T204 is an input terminal (pin) for the read enable signal REB (negative logic). The terminal T205 is a data I/O terminal (input/output pin) for a series of data including command, address and data. The terminal T206 is an input terminal for the clock signal CK adapted to control the chip I/O operation timing. The terminal T207 is an input terminal for the chip enable signal CEB (negative logic) adapted to select a chip.

The input of the input buffer 201 is connected to the terminal T201. The output of the input buffer 201 is connected to the input of the input latch 209. The output of the input latch 209 is connected to the input of the selection/holding circuit 216-1.

The input buffer 201 is enabled (activated) by an in-chip enable signal I.CE from the input buffer 207. As a result, the input buffer 201 loads the write enable signal WEB via the terminal T201 and outputs the signal to the input latch 209.

The input latch 209 latches the write enable signal WEB from the input buffer 201 in synchronism with an in-chip clock signal I.CK from the input buffer 206. Then, the input latch 209 outputs an in-chip write enable signal I.WEB to the selection/holding circuit 216-1.

The input of the input buffer 202 is connected to the terminal T202. The output of the input buffer 202 is connected to the input of the input latch 210. The output of the input latch 210 is connected to the input of the selection/holding circuit 216-2.

The input buffer 202 is enabled (activated) by the in-chip enable signal I.CE from the input buffer 207. As a result, the input buffer 202 loads the address latch enable signal ALE via the terminal T202 and outputs the signal to the input latch 210.

The input latch 210 latches the address latch enable signal ALE from the input buffer 202 in synchronism with the in-chip clock signal I.CK from the input buffer 206. Then, the input latch 210 outputs an in-chip address latch enable signal I.ALE to the selection/holding circuit 216-2.

The input of the input buffer 203 is connected to the terminal T203. The output of the input buffer 203 is connected to the input of the input latch 211. The output of the input latch 211 is connected to the input of the selection/holding circuit 216-3.

The input buffer 203 is enabled (activated) by the in-chip enable signal I.CE from the input buffer 207. As a result, the input buffer 203 loads the command latch enable signal CLE via the terminal T203 and outputs the signal to the input latch 211.

The input latch 211 latches the command latch enable signal CLE from the input buffer 203 in synchronism with the in-chip clock signal I.CK from the input buffer 206. Then, the input latch 211 outputs an in-chip command latch enable signal I.CLE to the selection/holding circuit 216-3.

The input of the input buffer 204 is connected to the terminal T204. The output of the input buffer 204 is connected to the input of the input latch 212. The output of the input latch 212 is connected to the input of a selection/holding circuit which is not shown.

The input buffer 204 is enabled (activated) by the in-chip enable signal I.CE from the input buffer 207. As a result, the input buffer 204 loads the read enable signal REB via the terminal T204 and outputs the signal to the input latch 212.

The input latch 212 latches the read enable signal REB from the input buffer 204 in synchronism with the in-chip clock signal I.CK from the input buffer 206. Then, the input latch 212 outputs an in-chip read enable signal I.REB.

The input of the input buffer 205 is connected to the terminal T205. The output of the input buffer 205 is connected to the input of the input latch 213. The output of the input latch 213 is connected to the input of the selection/holding circuit 216-4.

The input buffer 205 is enabled (activated) by the in-chip enable signal I.CE from the input buffer 207. As a result, the input buffer 205 loads a series of data including command, address and data via the terminal T205 and outputs the data to the input latch 213.

The input latch 213 latches the series of data including command, address and data from the input buffer 205 in synchronism with the in-chip clock signal I.CK from the input buffer 206. Then, the input latch 212 outputs in-chip IO data (command, address, data) I.IO[7:0] to the selection/holding circuit 216-4.

The input of the input buffer 206 is connected to the terminal T206. The output of the input buffer 206 is connected to the input of the n-bit counter (three-bit counter in the present embodiment) 214. The output of the input buffer 206 is also connected to the clock terminal of each of the input latches 209 to 213 and the clock terminal of each of the selection/holding circuits 216-1 to 216-4. The n-bit counter need only be capable of counting the number of bits in the series of data. In the present embodiment, the series of data is eight-bit data. As a result, n=3.

The input buffer 206 outputs the in-chip clock signal I.CK to the input of the three-bit counter 214. The input buffer 206 also outputs the in-chip clock signal I.CK to the clock terminal of each of the input latches 209 to 213 and the clock terminal of each of the selection/holding circuits 216-1 to 216-4.

The output of the three-bit counter 214 is decoded by the decoder 215. The decoder 215 outputs a decoded signal CNT<7:0> to the selection/holding circuits 216-1 to 216-4. The decoder 215 also outputs a decoded signal CNT<7> to a selector unit of each of the selection/holding circuits 216-1 to 216-4.

The input of the input buffer 207 is connected to the terminal T207. The output of the input buffer 207 is connected to the enable terminal of each of the input buffers 201 to 206 and to the enable terminal of the three-bit counter 214.

The input buffer 207 outputs the in-chip enable signal I.CE to the enable terminal of each of the input buffers 201 to 206 and to the enable terminal of the three-bit counter 214.

The first selection/holding circuit 216-1 sequentially selects and holds the plurality of in-chip write enable signals I.WEB (e.g., eight signals from zeroth to seventh) latched by the input latch 209. The same circuit 216-1 does so in synchronism with the in-chip clock signal I.CK and in accordance with the decoded signal CNT<7:0> of the decoder 215. For example, the same circuit 216-1 holds two sets of signals for a plurality of clocks (four clocks in the present embodiment), one set of the zeroth to third signals, and another of the fourth to seventh signals. Then, the same circuit 216-1 outputs them as signals WEB_0, WEB_1, WEB_2 and WEB_3 to the four-port command decoder 300.

The first selection/holding circuit 216-2 sequentially selects and holds the plurality of in-chip address latch enable signals I.ALE (e.g., eight signals from zeroth to seventh) latched by the input latch 210. The same circuit 216-2 does so in synchronism with the in-chip clock signal I.CK and in accordance with the decoded signal CNT<7:0> of the decoder 215. For example, the same circuit 216-2 holds two sets of signals for a plurality of clocks (four clocks in the present embodiment), one set of the zeroth to third signals, and another of the fourth to seventh signals. Then, the same circuit 216-2 outputs them as signals ALE_0, ALE_1, ALE_2 and ALE_3 to the four-port command decoder 300.

The first selection/holding circuit 216-3 sequentially selects and holds the plurality of in-chip command latch enable signals I.CLE (e.g., eight signals from zeroth to seventh) latched by the input latch 211. The same circuit 216-3 does so in synchronism with the in-chip clock signal I.CK and in accordance with the decoded signal CNT<7:0> of the decoder 215. For example, the same circuit 216-3 holds two sets of signals for a plurality of clocks (four clocks in the present embodiment), one set of the zeroth to third signals, and another of the fourth to seventh signals. Then, the same circuit 216-3 outputs them as signals CLE_0, CLE_1, CLE_2 and CLE_3 to the four-port command decoder 300.

The second selection/holding circuit 216-4 sequentially selects and holds the plurality of in-chip IO data (command, address, data) I.IO[7:0] (e.g., eight signals from zeroth to seventh) latched by the input latch 213. The same circuit 216-4 does so in synchronism with the in-chip clock signal I.CK and in accordance with the decoded signal CNT<7:0> of the decoder 215. For example, the same circuit 216-4 holds two sets of signals for a plurality of clocks (four clocks in the present embodiment), one set of the zeroth to third signals, and another of the fourth to seventh signals. Then, the same circuit 216-4 outputs them as signals D_BUS0[7:0], D_BUS1[7:0], D_BUS2[7:0] and D_BUS3[7:0] to the four-port command decoder/command latch 300.

The selection/holding circuits 216-1 to 216-4 have the same configuration. For simplification of the drawings, therefore, the specific configuration of only the selection/holding circuit 216-4 is illustrated.

Here, a description will be made about the specific configuration of the selection/holding circuit 216-4.

The selection/holding circuit 216 has a first selection/holding unit 2161 connected to the input latches (209, 210, 211, 213). The same circuit 216 also has a second selection/holding unit 2162 adapted to be supplied with data held by the first selection/holding unit 2161.

The first selection/holding unit 2161 includes a plurality (two raised to the nth power in the present embodiment; n=3 here) of three-input AND gates AD0 to AD7. The same unit 2161 also includes flip-flops FF0 to FF7 adapted to hold the outputs of the AND gates AD0 to AD7.

The three-input AND gates AD0 to AD7 each take a logical product of the in-chip IO data (command, address, data) I.IO[7:0] latched by the input latch 213, the decoded signal CNT<7:0> of the decoder 215 and the in-chip clock signal I.CK. Then, the gates AD0 to AD7 each output the obtained logical product respectively to the flip-flops FF0 to FF7.

The flip-flop FF0 holds an output signal of the AND gate AD0 and outputs held data FF0[7:0] to the second selection/holding unit 2162.

The flip-flop FF1 holds an output signal of the AND gate AD1 and outputs held data FF1[7:0] to the second selection/holding unit 2162.

The flip-flop FF2 holds an output signal of the AND gate AD2 and outputs held data FF2[7:0] to the second selection/holding unit 2162.

The flip-flop FF3 holds an output signal of the AND gate AD3 and outputs held data FF3[7:0] to the second selection/holding unit 2162.

The flip-flop FF4 holds an output signal of the AND gate AD4 and outputs held data FF4[7:0] to the second selection/holding unit 2162.

The flip-flop FF5 holds an output signal of the AND gate AD5 and outputs held data FF5[7:0] to the second selection/holding unit 2162.

The flip-flop FF6 holds an output signal of the AND gate AD6 and outputs held data FF6[7:0] to the second selection/holding unit 2162.

The flip-flop FF7 holds an output signal of the AND gate AD7 and outputs held data FF7[7:0] to the second selection/holding unit 2162.

The second selection/holding unit 2162 classifies the signals FF0[7:0] to FF7[7:0] from the first selection/holding unit 2161 into a plurality of signal groups. In the present embodiment, the same unit 2162 classifies the signals into two groups, a first signal group of the zeroth to third signals FF0[7:0] to FF3[7:0] and a second signal group of the fourth to seventh signals FF4[7:0] to FF7[7:0]. The same unit 2162 holds these signals for a plurality of clocks (four clocks in the present embodiment). Then, the same unit 2162 outputs these signals, in response to the decoded signal CNT7, as D_BUS0 [7:0], D_BUS1[7:0], D_BUS2[7:0] and D_BUS3[7:0] to the four-port command decoder 300.

The second selection/holding unit 2162 outputs four pairs of signals, one signal from the first signal group of the zeroth to third signals, and another from the second signal group of the fourth to seventh signals, to the four-port command decoder/command latch 300. That is, the same unit 2162 outputs a pair of the signal FF0[7:0] from the first group and the signal FF4[7:0] from the second group as the first signal D_BUS0[7:0]. The same unit 2162 outputs a pair of the signal FF1[7:0] from the first group and the signal FF5[7:0] from the second group as the second signal D_BUS1[7:0]. The same unit 2162 outputs a pair of the signal FF2[7:0] from the first group and the signal FF6[7:0] from the second group as the third signal D_BUS2[7:0]. The same unit 2162 outputs a pair of the signal FF3[7:0] from the first group and the signal FF7[7:0] from the second group as the fourth signal D_BUS3 [7:0].

The four-port command decoder/command latch 300 receives four clocks of four sets of the in-chip write enable signals WEB_0, WEB_1, WEB_2 and WEB_3 from the selection/holding circuit 216-1. Further, the same decoder 300 receives four sets of the in-chip address latch enable signals ALE_0, ALE_1, ALE_2 and ALE_3 from the selection/holding circuit 216-2. Still further, the same decoder 300 receives four sets of the in-chip command latch enable signals CLE_0, CLE_1, CLE_2 and CLE_3 from the selection/holding circuit 216-3. Still further, the same decoder 300 receives the signals D_BUS0[7:0], D_BUS1[7:0], D_BUS2[7:0] and D_BUS3[7:0] from the selection/holding circuit 216-4. The same decoder 300 receives these signals with its four ports on a route-by-route (set-by-set) basis. The same decoder 300 determines the operation of and input data to the memory core 800 of the NAND-type flash memory 100 based on 16 (two raised to the fourth power) possible states formed by the four sets of values.

As a result of decoding, the four-port command decoder/command latch 300 transfers the received signals to its command latch if the signals are a command. The same decoder 300 transfers the received signals to the row or column address latch 400 or 500 if the signals are an address. The same decoder 300 transfers the received signals to the page buffer 700 if the signals are data.

Figure 5:
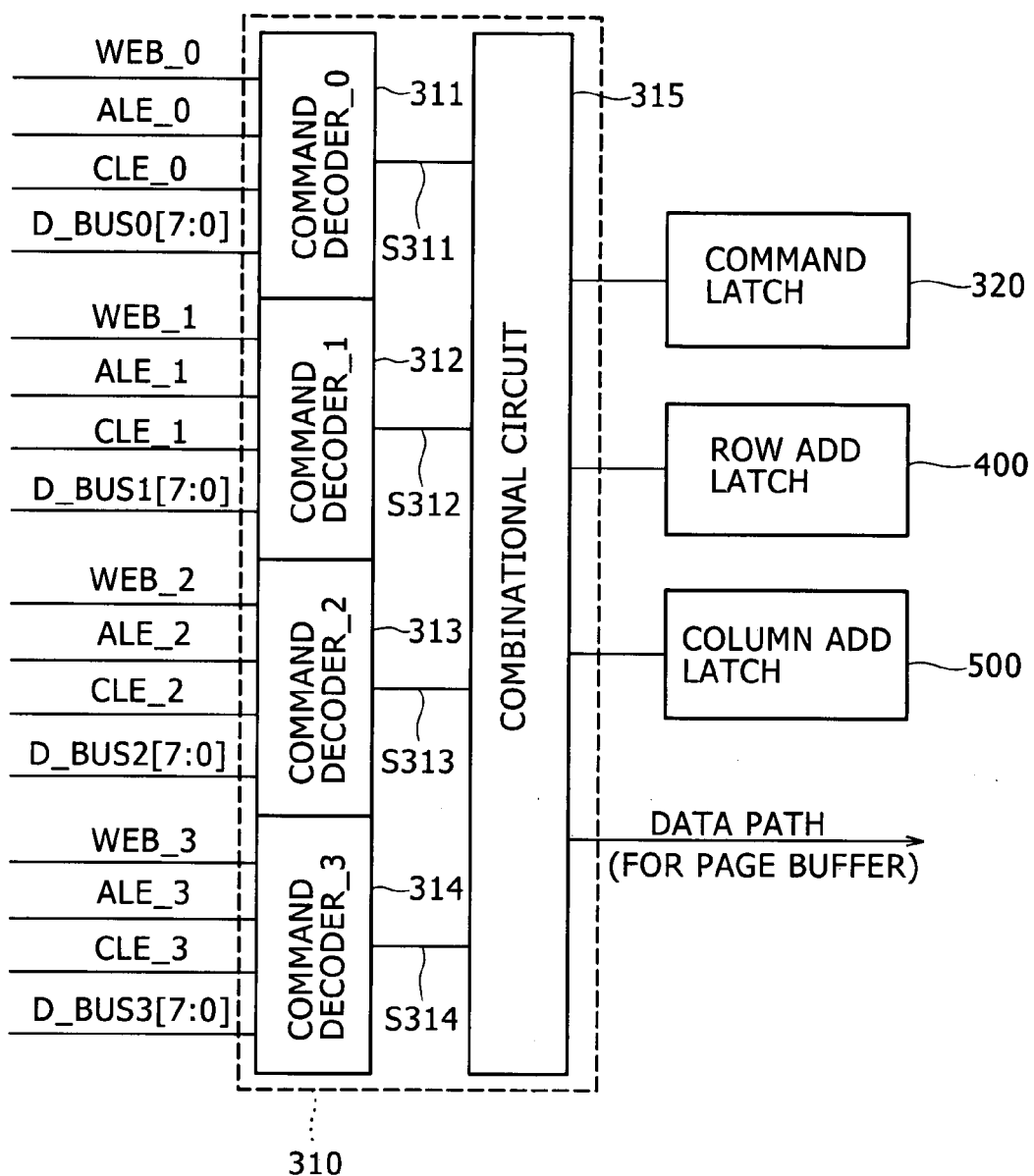
FIG. 5 is a block diagram illustrating a configuration example of a four-port command decoder/command latch 300 according to the present embodiment.

FIG. 5 is a block diagram illustrating a configuration example of the four-port command decoder/command latch 300 according to the present embodiment.

The four-port command decoder/command latch 300 illustrated in FIG. 5 includes a four-port command decoder 310 and a command latch 320.

The four-port command decoder 310 includes first to fourth command decoders 311 to 314 and a combinational circuit 315.

The first command decoder 311 decodes the in-chip write enable signal WEB_0 from the selection/holding circuit 216-1 and the in-chip address latch enable signal ALE_0 from the selection/holding circuit 216-2. The same decoder 311 also decodes the in-chip command latch enable signal CLE_0 from the selection/holding circuit 216-3 and the signal D_BUS0[7:0] from the selection/holding circuit 216-4. The same decoder 311 outputs the decoding result to the combinational circuit 315 as a signal S311.

The second command decoder 312 decodes the in-chip write enable signal WEB_1 from the selection/holding circuit 216-1 and the in-chip address latch enable signal ALE_1 from the selection/holding circuit 216-2. The same decoder 312 also decodes the in-chip command latch enable signal CLE_1 from the selection/holding circuit 216-3 and the signal D_BUS1[7:0] from the selection/holding circuit 216-4. The same decoder 312 outputs the decoding result to the combinational circuit 315 as a signal S312.

The third command decoder 313 decodes the in-chip write enable signal WEB_2 from the selection/holding circuit 216-1 and the in-chip address latch enable signal ALE_2 from the selection/holding circuit 216-2. The same decoder 313 also decodes the in-chip command latch enable signal CLE_2 from the selection/holding circuit 216-3 and the signal D_BUS2[7:0] from the selection/holding circuit 216-4. The same decoder 313 outputs the decoding result to the combinational circuit 315 as a signal S313.

The fourth command decoder 314 decodes the in-chip write enable signal WEB_3 from the selection/holding circuit 216-1 and the in-chip address latch enable signal ALE_3 from the selection/holding circuit 216-2. The same decoder 314 also decodes the in-chip command latch enable signal CLE_3 from the selection/holding circuit 216-3 and the signal D_BUS3[7:0] from the selection/holding circuit 216-4. The same decoder 314 outputs the decoding result to the combinational circuit 315 as a signal S314.

In response to the decoded signals S311 to S314 from the first to fourth decoders 311 to 314, the combinational circuit 315 determines the operation of and input data to the memory core 800 of the NAND-type flash memory 100 based on 16 (two raised to the fourth power) possible states formed by the four sets of values.

As a result of decoding, the combinational circuit 315 loads the received signals into the command latch 320 if the signals are a command. The same circuit 315 loads the received signals into the row or column address latch 400 or 500 if the signals are an address. The same circuit 315 transfers the received signals to the page buffer 700 if the signals are data.

A description will be made below about the operation of the NAND-type flash memory 100 having the above configuration, with particular emphasis on the operation of the interface circuit. Then, the specific configuration and operation of the memory core 800 will be described.

In the interface circuit 200, the chip enable signal CEB from the terminal T207 is held temporarily by the input buffer 207. The in-chip enable signal I.CE from the terminal T207 activates the input buffers 201 to 206 which are connected respectively to the other terminals T201 to T206.

The write enable signal WEB from the terminal T201 is loaded into the activated input buffer 201. The address latch enable signal ALE from the terminal T202 is loaded into the activated input buffer 202. The command latch enable signal CLE from the terminal T203 is loaded into the activated input buffer 203. The read enable signal REB from the terminal T204 is loaded into the activated input buffer 204. The data (command, address, data) IO[7:0] from the terminal T205 is loaded into the activated input buffer 205. The clock signal CK from the terminal T206 is loaded into the activated input buffer 206.

As described above, the clock signal CK, adapted to control the chip I/O operation timing, is loaded via the terminal T206 and held temporarily by the input buffer 206. The write enable signal WEB, the address latch enable signal ALE, the command latch enable signal CLE and the series of data (command, address, data) IO[7:0], loaded respectively into the input buffers 201 to 203 and 205, are latched respectively and temporarily into the input latches 209 to 211 and 213 in synchronism with the in-chip clock signal I.CK from the input buffer 206.

The write enable signal WEB, the address latch enable signal ALE, the command latch enable signal CLE and the series of data (command, address, data) IO[7:0], latched respectively and temporarily into the input latches 209 to 211 and 213, are supplied to the associated selection/holding circuits 216-1 to 216-4.

The selection/holding circuits 216-1 to 216-4 are each provided, for example, with the eight AND gates AD0 to AD7 and the eight flip-flops FF0 to FF7 as illustrated in FIG. 4. One of the eight AND gates AD0 to AD7 is selected in accordance with the decoding result of the three-bit counter 214 connected to the input buffer 206 which latches the clock signal CK. This allows the values held by the input latches 209 to 211 and 213 to be transferred to the flip-flops FF0 to FF7. As a result, the values are held by the flip-flops FF0 to FF7.

The in-chip signals (e.g., FF0[7:0] to FF7[7:0]), which are the outputs of the eight flip-flops FF0 to FF7, are supplied to the second selection/holding unit 2162. As a result, two values, one from the signal group of the zeroth to third signals, and another from the signal group of the fourth to seventh signals, are held. Then, four clocks of the in-chip signals (e.g., D_BUS0[7:0] to D_BUS3[7:0]) are output to the four-port command decoder/command latch 300.

This allows for four clocks of input values to be held, thus permitting decoding and other processing.

These four clocks of the in-chip write enable signals I.WEB, the in-chip address latch enable signals I.ALE, the in-chip command latch enable signals I.CLE and the I.IO values are decoded by the four-port command decoder 310. For decoding, it is determined whether four sets of values have been input. If so, the distinction between command, address and data is transferred and stored in the address latches or other units for decoding. This allows for decoding even with this type of high-speed interface.

Figure 6:
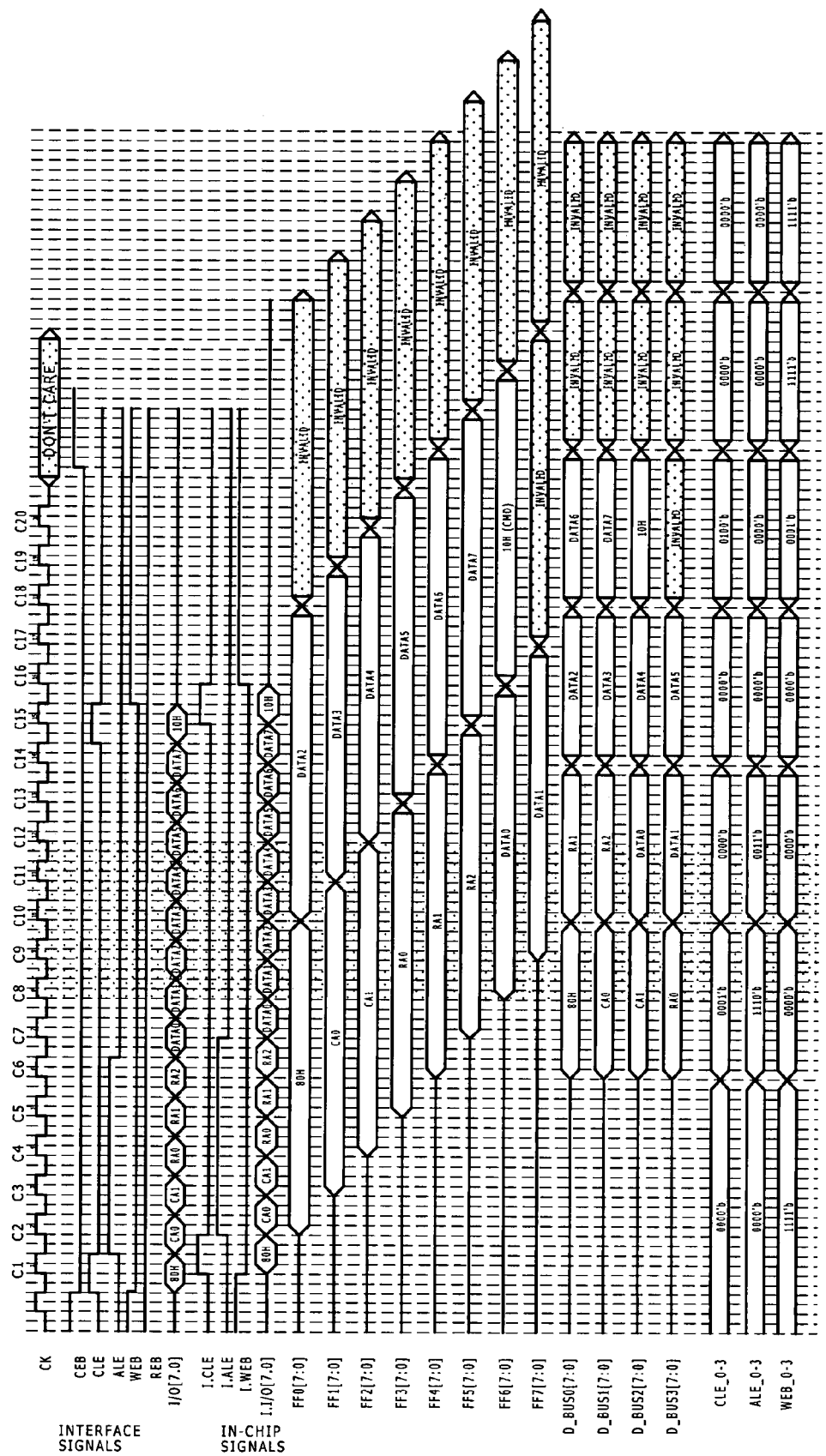
FIG. 6 is a view illustrating input waveforms and the signal operation in the chip during a write operation to a NAND-type flash memory according to the present embodiment having a high-speed synchronous interface circuit in synchronism with a clock signal CK.

FIG. 6 is a view illustrating input waveforms and the signal operation in the chip during a write operation to a NAND-type flash memory according to the present embodiment having a high-speed synchronous interface circuit in synchronism with the clock signal CK.

In the example illustrated in FIG. 6, the chip is selected by pulling the chip enable signal CEB (negative logic) down to low level. The chip enable signal CEB is an interface signal.

The write enable signal WEB (negative logic), adapted to select input operation, is pulled down to low level at the leading edge of the clock signal CK (cycle C1). Further, in the same cycle, the command latch enable signal CLE (positive logic), adapted to select command input, is pulled up to high level, and the address latch enable signal ALE (positive logic), adapted to select address input, is pulled down to low level. Still further, a command is input from the I/O terminal T207 adapted to input and output data.

In cycle C2, the command latch enable signal CLE is pulled down to low level. Further, the address latch enable signal ALE is pulled up to high level. As a result, an address is input from the I/O terminal T207. Cycles C2 to C6 are address inputs.

In cycle C7, the command latch enable signal CLE is pulled down to low level. Further, the address latch enable signal ALE is pulled down to low level. As a result, data is input from the I/O terminal T207. In this example, cycles C7 to C14 are data inputs.

In cycle C15, the command latch enable signal CLE is pulled up to high level. Further, the address latch enable signal ALE is pulled down to low level. As a result, a command is input from the I/O terminal T207, thus initiating a write operation.

In this example, the read enable signal REB (negative logic), adapted to select output operation, remains at high level.

With an ordinary low-speed asynchronous interface, the chip detects whether the write enable signal is active. As a result, the chip activates the command latch enable signal CLE, the address latch enable signal ALE and the I/O input buffers. At the same time, the chip identifies an input from the I/O as a command, address or data for processing. However, there is not enough time for all the series of processing with a high-speed interface.

In the present embodiment, therefore, the chip temporarily loads control signals such as the write enable signal WEB, the address latch enable signal ALE and the command latch enable signal CLE as well as inputs from the I/O in synchronism with the clock signal CK prior to processing.

Therefore, even if peripheral circuitry transistors offer extremely low performance due to the limitation of their gate film thickness by the gate film thickness of the memory cell, such transistors are applicable to high-speed inputs of memory control signals, command, address and so on in synchronism with the clock rather than external equipment.

It should be noted that although, in the present embodiment, a case was shown where a plurality of AND gates and flip-flops (eight in the present embodiment) are provided as the first selection/holding unit 2161 of the selection/holding circuit 216, the present invention is not limited to this configuration but may be modified in various manners.

Figure 7:
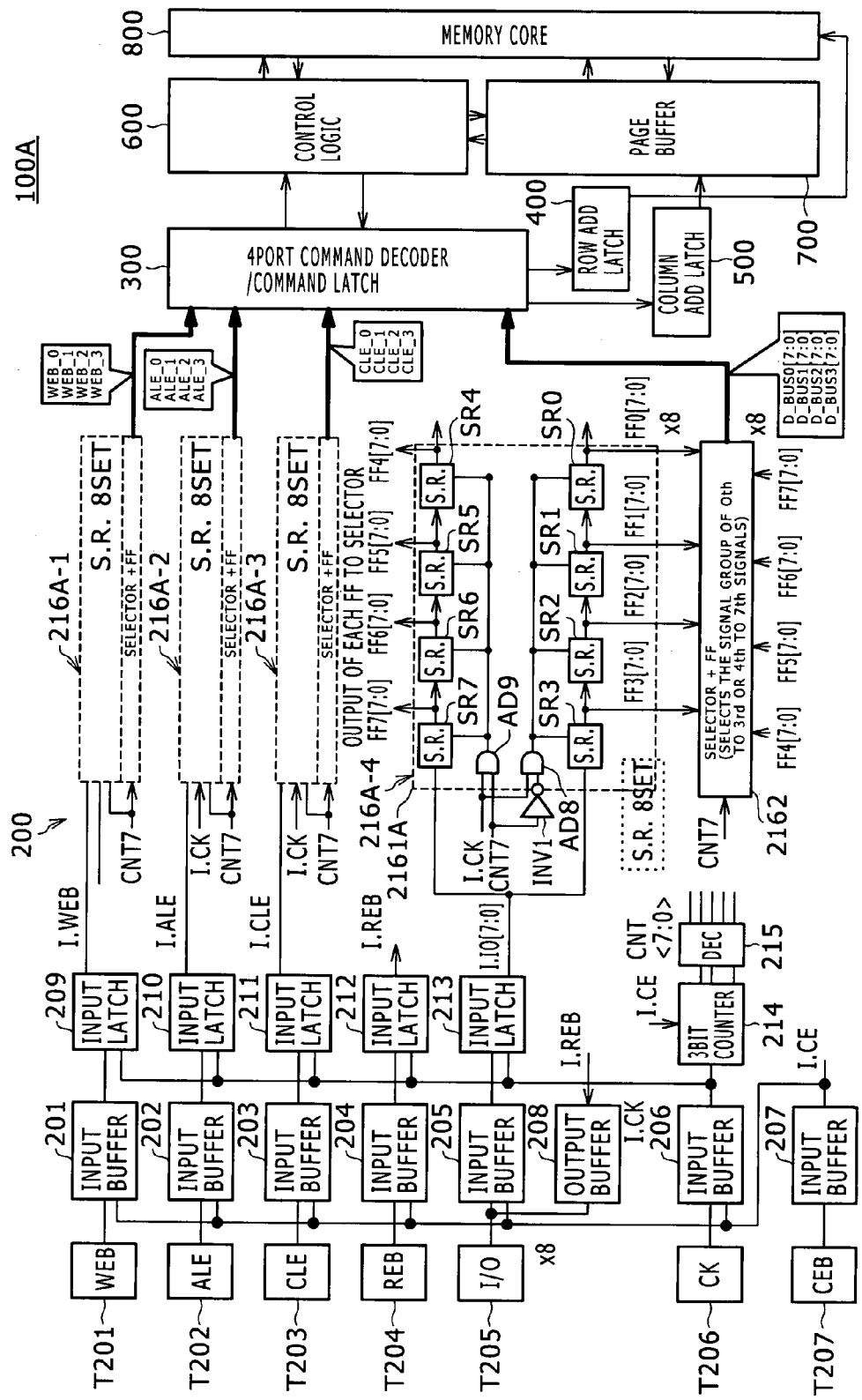
FIG. 7 is a block diagram illustrating another configuration example of the NAND-type EEPROM (flash memory) which is a nonvolatile semiconductor storage device according to the present embodiment.

FIG. 7 is a block diagram illustrating another configuration example of the NAND-type EEPROM (flash memory) which is a nonvolatile semiconductor storage device according to the present embodiment.

A NAND-type flash memory 100A in FIG. 7 differs from the NAND-type flash memory 100 in FIG. 4 in the configuration of the first selection/holding unit 2161 of the selection/holding circuits 216.

In the example illustrated in FIG. 7, a first selection/holding unit 2161A includes two two-input AND gates AD8 and AD9, an inverter INV1 and a plurality of (eight in the present embodiment) shift registers SR0 to SR7, rather than a plurality of (eight) AND gates and flip-flops.

The first input of each of the AND gates AD8 and AD9 is connected to the supply line of the in-chip clock signal I.CK (output line of the input buffer 206). The input terminal of the inverter INV1 and the second input terminal of the AND gate AD2 are connected to the supply line of the decoded signal CNT<7> (output line of the decoder 215). The output terminal of the inverter INV1 is connected to the second input terminal of the AND gate AD8.

The output of the AND gate 8 is connected to the clock terminal of each of the shift registers SR0 to SR3 which are cascade-connected with each other. The output of the AND gate 9 is connected to the clock terminal of each of the shift registers SR4 to SR7 which are cascade-connected with each other.

The output of each of the input latches 209, 210, 211 and 213 is cascade-connected sequentially to the shift registers SR3, SR2, SR1 and SR0 in this order from the output side.

Similarly, the output of each of the input latches 209, 210, 211 and 213 is cascade-connected sequentially to the shift registers SR7, SR6, SR5 and SR4 in this order from the output side.

In the first selection/holding unit 2161A configured as described above, the first shift register column including the shift registers SR3 to SR0 and the second shift register column including the shift registers SR7 to SR4 perform shift operations in a complementary manner.

More specifically, when the decoded signal CNT7 is at low level, the output of the inverter INV1 is at high level. Therefore, the clock signal I.CK is supplied from the AND gate AD8 to the first shift register column. In contrast, the output of the clock signal I.CK from the AND gate AD9 is inhibited.

As a result, the output I.IO[7:0] of the input buffer 213 is sequentially shifted through the shift registers SR3 to SR0 in this order in four clocks in synchronism with the clock signal I.CK. In this case, the signals FF0[7:0], FF1[7:0], FF2[7:0] and FF3[7:0] are output respectively from the shift registers SR0, SR1, SR2 and SR3 to the second selection/holding unit 2162.

When the decoded signal CNT7 is at high level, the output of the inverter INV1 is at low level. This inhibits the supply of the clock signal I.CK from the AND gate AD8 to the first shift register column. In contrast, the clock signal I.CK is supplied from the AND gate AD9 to the second shift register column.

As a result, the output I.IO[7:0] of the input buffer 213 is sequentially shifted through the shift registers SR7 to SR4 in this order in four clocks in synchronism with the clock signal I.CK. In this case, the signals FF4[7:0], FF5[7:0], FF6[7:0] and FF7[7:0] are output respectively from the shift registers SR4, SR5, SR6 and SR7 to the second selection/holding unit 2162.

As with that in the example illustrated in FIG. 4, the second selection/holding unit 2162 classifies the signals FF0[7:0] to FF7[7:0] from the first selection/holding unit 2161 into a plurality of signal groups. In the present embodiment, the same unit 2162 classifies the signals into two groups, a first signal group of the zeroth to third signals FF0[7:0] to FF3[7:0] and a second signal group of the fourth to seventh signals FF4[7:0] to FF7[7:0]. The same unit 2162 holds a plurality of clocks (four clocks in the present embodiment) of these signals. Then, the same unit 2162 outputs these signals, in response to the decoded signal CNT7, as D_BUS0[7:0], D_BUS1[7:0], D_BUS2[7:0] and D_BUS3[7:0] to the four-port command decoder 300.

The remaining configuration of the NAND-type flash memory 100A, other than the above, is the same as that of the NAND-type flash memory 100 in FIG. 4.

The configuration in FIG. 7 allows simplification of the configuration of the selection/holding circuits 216 as well as provides the same effect as that in FIG. 4.

Thus, the configuration and operation of the NAND-type flash memories 100 and 100A according to the present embodiment have been described with particular emphasis on the operation of the interface circuit.

Next, a description will be made about the specific configuration and operation of the memory core 800 of the NAND-type flash memories 100 and 100A according to the present embodiment.

Figure 8:
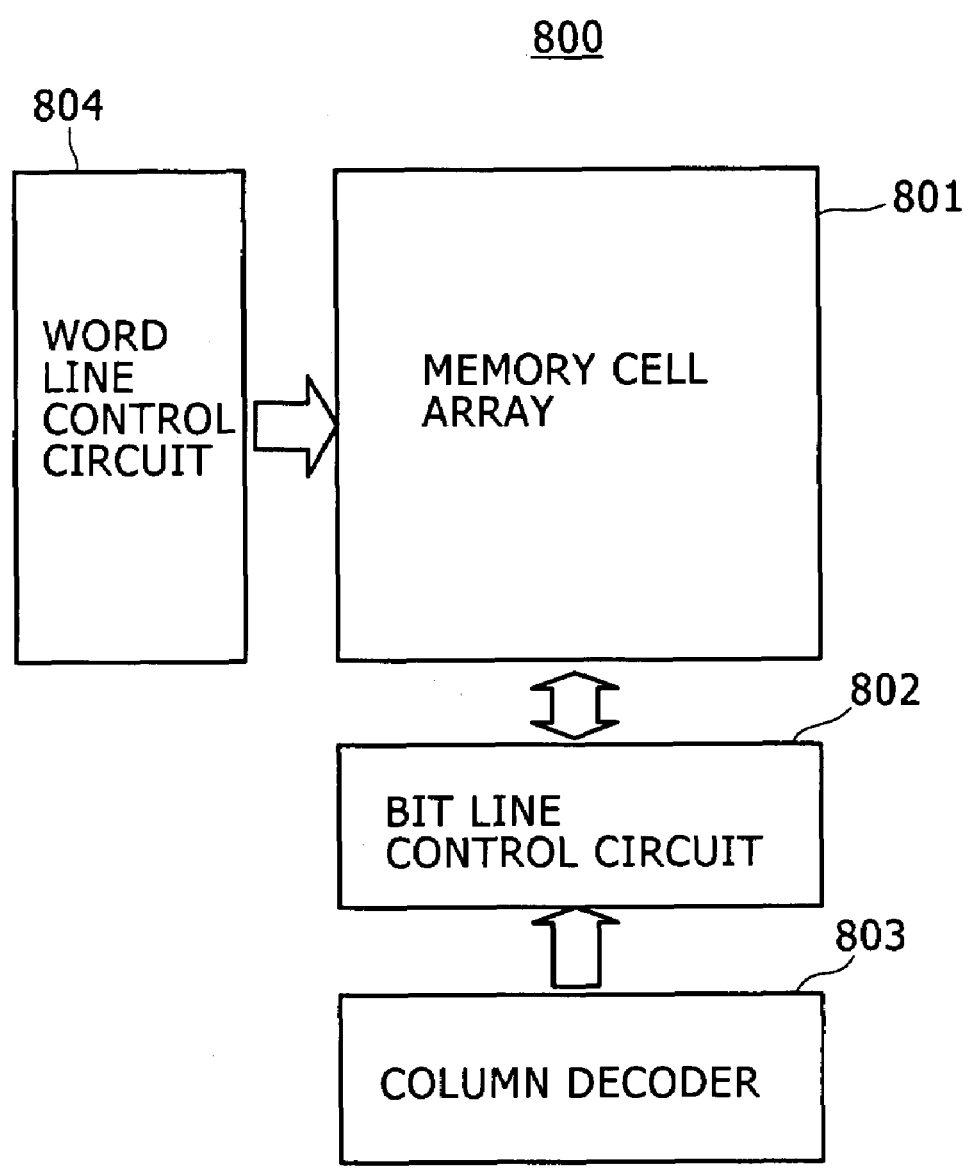
FIG. 8 is a block diagram illustrating a configuration example of a memory core in the NAND-type flash memory according to the present embodiment.

FIG. 8 is a block diagram illustrating a configuration example of the memory core in the NAND-type flash memory according to the present embodiment.

The memory core 800 in FIG. 8 includes a memory cell array 801, a bit line control circuit 802, a column decoder 803 and a word line control circuit 804.

As described in detail later with reference to FIG. 9, the memory cell array 801 includes a plurality of NAND-type memory cell units, bit lines, word lines and source lines.

The NAND-type memory cell units each include a memory cell column including a plurality of memory cells connected in series with each other and select transistors, one connected to each of the two ends of the memory cell column. The source lines are shared by all the memory cell units.

The bit line control circuit 802 reads data from a memory cell and detects the memory cell status via a bit line. The same circuit 802 also writes data to a memory cell via a bit line by applying a write control voltage to the memory cell.

The bit line control circuit 802 includes a plurality of data storage circuits. The data storage circuits are provided for columns of the memory cell array 801. Data in the memory cell read by the data storage circuit selected by the column decoder 803 is output to external equipment from the interface circuit 200 via the input buffer which is not shown.

On the other hand, write data input from external equipment via the interface circuit 200 passes through the page buffer 700 and is latched into the data storage circuit selected by the column decoder 803 as initial control data. The control data in the data storage circuit controls a write control voltage applied to a select memory cell of the memory cell array 801 via a bit line.

The word line control circuit 804 selects one of a plurality of word lines of the memory cell array 801 and applies a given potential requisite for read, write or delete operation to the selected word line.

Figure 9:
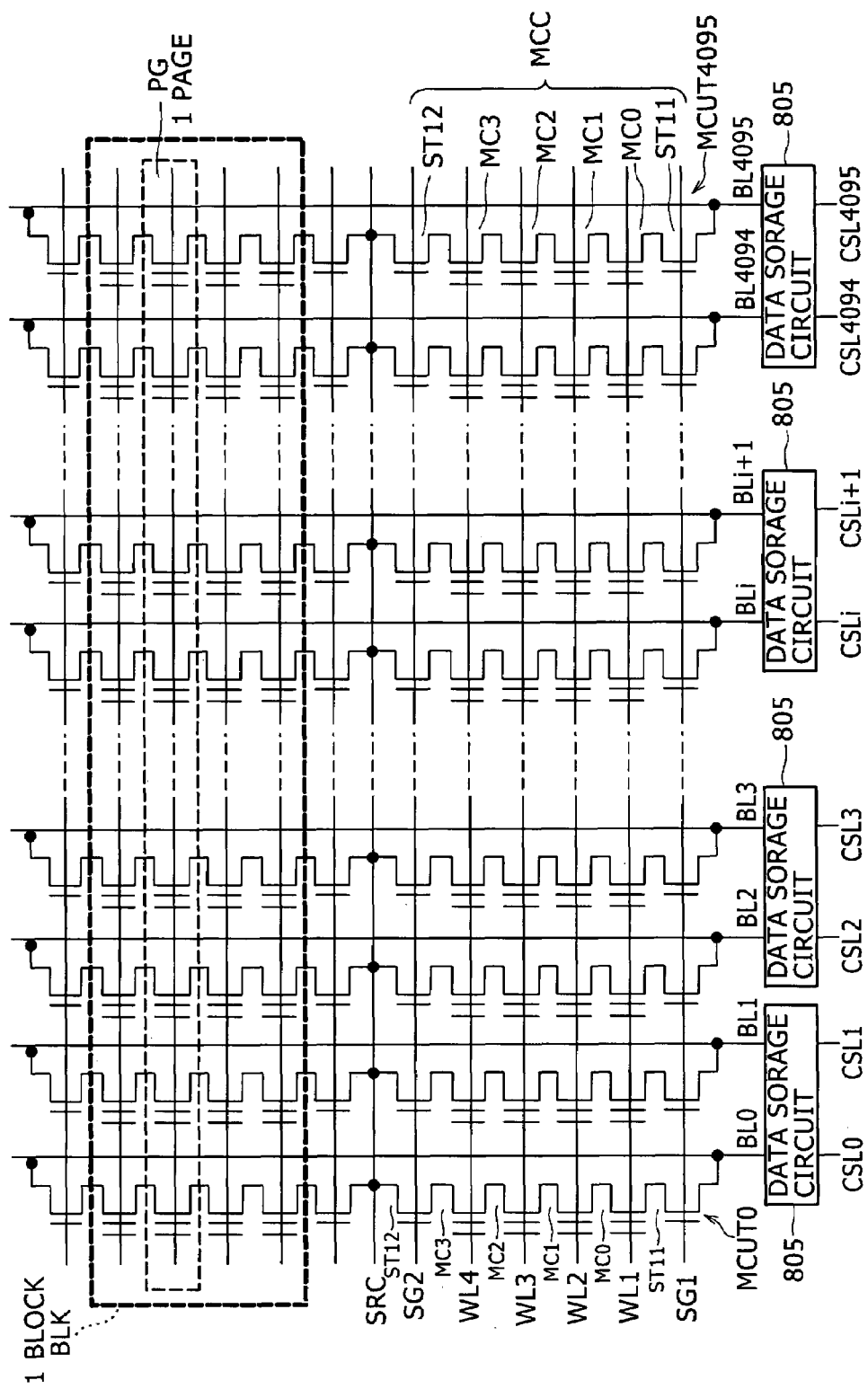
FIG. 9 is a view illustrating a configuration example of a memory cell array and a bit line control circuit illustrated in FIG. 8.

FIG. 9 is a view illustrating a configuration example of the memory cell array 801 and the bit line control circuit 802 illustrated in FIG. 8.

A NAND-type memory cell unit MCUT includes a memory cell column MCC including four memory cells MC0 to MC3 connected in series with each other. The same unit MCUT further includes a select transistor ST11 connected between one end of the memory cell column MCC and a bit line BL. The same unit MCUT still further includes a select transistor ST12 connected between the other end of the memory cell column MCC and a source line SRC.

A control gate of a memory cell M is connected to a word line WLm (m is one of 1 to 4). The select transistor ST11 on the bit line side is connected to a select gate line SG1. The select transistor ST12 on the source line side is connected to a select gate line SG2.

The plurality of memory cells MC which share the word line WLm constitute a unit called a "page PG." In the case of this example, one block BLK includes four pages.

Although two blocks are shown in this example, a memory cell array 11 includes, in reality, any number of blocks (e.g., 1024 blocks). Further, in this example, the number of the bit lines BL is 4096 from the bit lines BL0 to BL4095. However, there may be any number of bit lines (e.g., 2048, 2112, 4224).

The bit line control circuit 802 includes a plurality of data storage circuits 805.

In this example, one of the data storage circuits 805 is provided for two bit lines BLi and BLi+1 (i is 0 or an even number). However, one of the data storage circuits 805 may be provided for any number of bit lines (e.g., one, four, six, or nine bit lines).

Column select signals CSL0 to CSL4095 are output signals from the column decoder 803. The column select signals CSLi and CSLi+1 are fed to the data storage circuit 805 connected to the bit lines BLi and BLi+1.

During read operation, the memory cell data latched by the data storage circuit 805 selected by the column select signals CSLi and CSLi+1 is guided to a data I/O buffer 14 as read data.

On the other hand, prior to write operation, control data is transferred to either the bit line BLi or Bli+1 based on the column select signals CSLi and CSLi+1. This control data is adapted to control a write control voltage applied to the memory cell during write operation.

For detection of the write status, the write status of the memory cell connected to either the bit line BLi or Bli+1 is detected.

Figure 10:
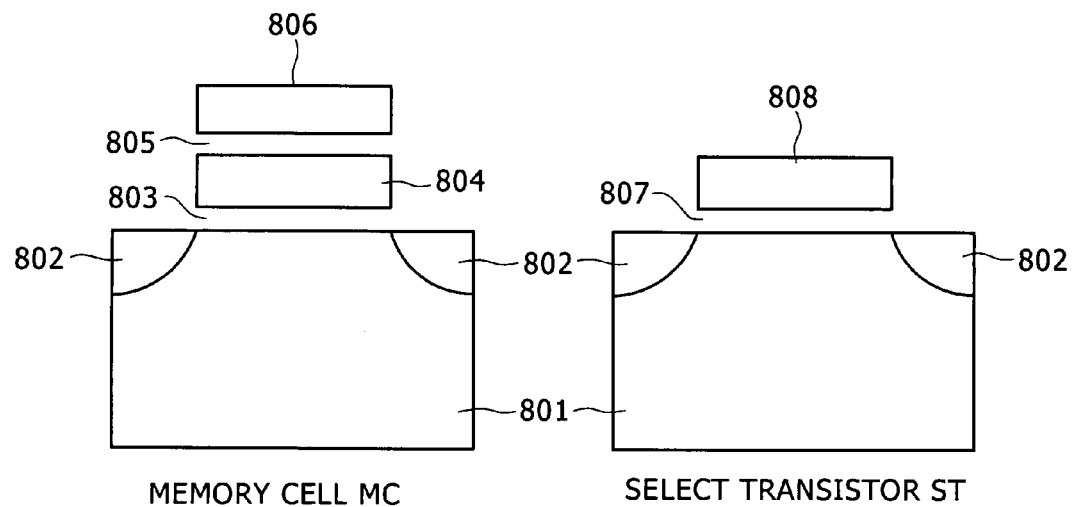
FIG. 10 is a view illustrating, in a simplified manner, the structures of a memory cell MC and a select transistor ST illustrated in FIG. 9.

FIG. 10 is a view illustrating, in a simplified manner, the structures of the memory cell MC and the select transistor ST illustrated in FIG. 9.

As illustrated in FIG. 10, an n-type diffusion layer 812 which serves as a source or drain is formed on a p-type semiconductor substrate 811.

The memory cell MC includes the n-type diffusion layer 812 in the semiconductor substrate 811, a gate insulation film 813 on the semiconductor substrate 811, a floating gate 814 on the gate insulation film 813, an insulation film 815 on the floating gate 814 and a control gate (word line) 816 on the insulation film 815.

The select transistor ST includes the n-type diffusion layer 812 in the semiconductor substrate 811, a gate insulation film 817 on the semiconductor substrate 811 and a select gate 818 on the gate insulation film 817.

As a potential equal to or greater than a threshold value of the memory cell MC is applied to the control gate 816 of the memory cell MC, a channel is formed on the surface of the semiconductor substrate 811 immediately beneath the floating gate 814.

For example, we assume that the capacitance between the control gate 816 and the floating gate 814 is 1 fF, that between the floating gate 814 and the channel 1 fF, that between the channel and the semiconductor substrate 811 0.25 fF and that between the n-type diffusion layer 812 and the semiconductor substrate 811 0.25 fF. Then, the coupling capacitance ratio of the control gate 816 to the channel is 50%. The coupling capacitance ratio of the control gate 816 to the n-type diffusion layer 812 is also 50%.

In this case, if the channel and the n-type diffusion layer 812 are floating, increase in potential of the control gate 816 by 1V will cause the potentials of the channel and the n-type diffusion layer 812 to increase 0.5V.

Figure 11:
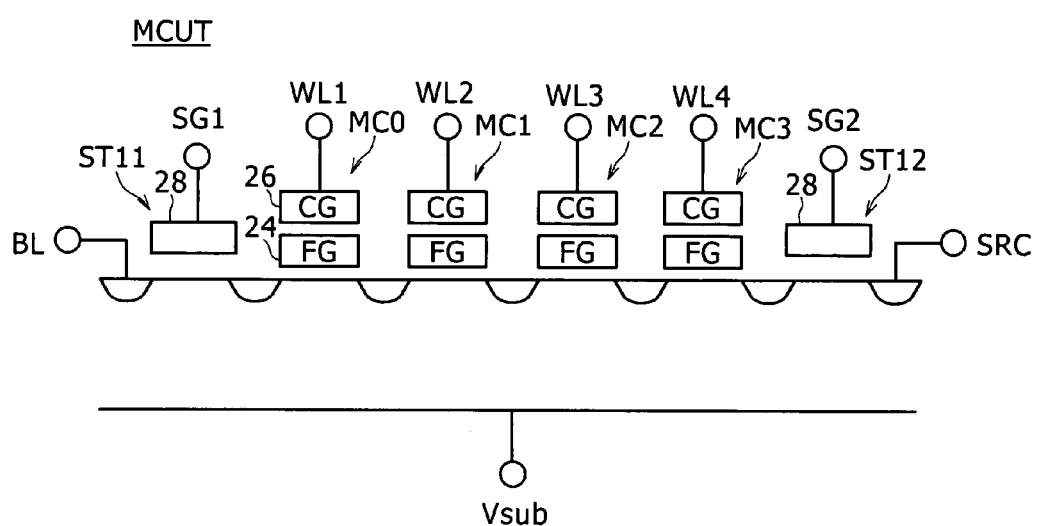
FIG. 11 is a view illustrating, in a simplified manner, the structure of a NAND-type memory cell unit MCUT illustrated in FIG. 9.

FIG. 11 is a view illustrating, in a simplified manner, the structure of the NAND-type memory cell unit illustrated in FIG. 9.

In the present embodiment, four memory cells MC0 to MC3 make up the memory cell column MCC. One end of the memory cell column MCC is connected to the source line SRC via the select transistor ST12. The other end of the memory cell column MCC is connected to the bit line BL via the select transistor ST11.

It should be understood by those skilled in the art that various modifications, combinations, sub-combinations and alterations may occur depending on design requirements and other factor in so far as they are within the scope of the appended claims or the equivalents thereof.

What is claimed is:

1. A semiconductor storage device comprising:
   a memory core having memory cells to be accessed; and
   an interface circuit having terminals operable to input and output a chip enable signal adapted to select a chip, at least one control signal adapted to control the chip operation, a clock signal adapted to control the chip I/O operation timing and a series of data including a command, address and data; wherein
   the interface circuit includes at least one input holding unit adapted to hold the control signal, and
   the interface circuit processes the control signal after loading it temporarily into the first input holding unit.

2. The semiconductor storage device of claim 1, wherein
   the interface circuit comprises a second input holding unit adapted to hold a series of data including a command, address and data, and
   the interface circuit loads the control signal into the first input holding unit and loads the series of data into the second input holding unit in synchronism with the clock signal.

3. The semiconductor storage device of claim 2, wherein
   the first input holding unit includes
      at least one first input buffer adapted to be activated by the chip enable signal and load the control signal, and
      at least one first input latch adapted to latch the control signal, loaded into the first input buffer, in synchronism with the clock signal, and
   the second input holding unit includes
      at least one second input buffer adapted to be activated by the chip enable signal and load the series of data, and
      at least one second input latch adapted to latch the series of data, loaded into the second input buffer, in synchronism with the clock signal.

4. The semiconductor storage device of claim 3 comprising:
   a first selection/holding circuit adapted to select and hold the control signal, latched by the first input latch, for a plurality of clocks of the clock signal and output the control signal in a parallel manner after classifying the signal into a plurality of signal groups; and
   a second selection/holding circuit adapted to select and hold the series of data, latched by the second input latch, for a plurality of clocks of the clock signal and output the series of data in a parallel manner after classifying the series of data into a plurality of signal groups.

5. The semiconductor storage device of claim 4 comprising:
   a third input buffer adapted to be activated by the chip enable signal and load the clock signal; wherein
   the first and second input latches latch the control signal and the series of data in synchronism with the clock signal temporarily loaded into the third input buffer.

6. The semiconductor storage device of claim 5 comprising:
   an n-bit counter capable of counting the clock signal held by the third input buffer for n bits of the series of data; wherein
   at least one of the first and second selection/holding circuits selects and holds the control signal and the series of data for a plurality of clocks of the clock signal based on a count value of the n-bit counter and in synchronism with the clock signal held by the third input buffer, and
   at least one of the first and second selection/holding circuits outputs the control signal and the series of data in a parallel manner after classifying the signal and the data into a plurality of signal groups.

7. The semiconductor storage device of claim 6 comprising:
   a multi-port command decoder adapted to receive a plurality of sets of output values from the first and second selection/holding circuits and determine the operation of and input data to the memory core.

8. The semiconductor storage device of claim 4 comprising:
   a multi-port command decoder adapted to receive a plurality of sets of output values from the first and second selection/holding circuits and determine the operation of and input data to the memory core.

9. The semiconductor storage device of claim 3 comprising:
   a third input buffer adapted to be activated by the chip enable signal and load the clock signal; wherein
   the first and second input latches latch the control signal and the series of data in synchronism with the clock signal temporarily loaded into the third input buffer.

10. The semiconductor storage device of claim 1, wherein
    the control signal is at least one of a command latch enable signal adapted to load a command into the chip, an address latch enable signal adapted to load an address and a write enable signal adapted to load data.

11. A nonvolatile semiconductor storage device comprising:
    a memory core having memory cells to be accessed; and
    an interface circuit having terminals operable to input and output a chip enable signal adapted to select a chip, at least one control signal adapted to control the chip operation, a clock signal adapted to control the chip I/O operation timing and a series of data including a command, address and data;
    wherein the memory core includes
       a memory cell array having rewritable nonvolatile memory cells arranged in an array form,
       means for selecting a word line of the memory cell array,
       means for selecting a bit line of the memory cell array, and
       a circuit with latch function which is connected to the bit lines of the memory cell array, and
    the interface circuit loads the control signal as logic data "1" or "0", as it does the data, into the nonvolatile semiconductor storage device provided in the chip in synchronism with the clock signal.

12. The nonvolatile semiconductor storage device of claim 11, wherein
    the memory cell array has NAND-type memory cell units arranged in an array form, and
    each of the memory cell units comprises:
       a memory cell column having N rewritable nonvolatile memory cells connected in series with each other;
       a bit line side select gate connected in series between the memory cell column and a bit line; and
       a source-side select gate connected in series between the memory cell column and a source line.

13. The nonvolatile semiconductor storage device of claim 11, wherein the control signal is at least one of a command latch enable signal adapted to load a command into the nonvolatile semiconductor storage device, an address latch enable signal adapted to load an address and a write enable signal adapted to load data.

14. A nonvolatile semiconductor storage device comprising:
a memory core having memory cells to be accessed; and
an interface circuit adapted to receive a chip enable signal adapted to select the nonvolatile semiconductor storage device, a clock signal adapted to control the chip I/O operation timing, a command latch enable signal adapted to load a command into the nonvolatile semiconductor storage device, an address latch enable signal adapted to load an address and a write enable signal adapted to load data; wherein
the memory core includes
a memory cell array having NAND-type memory cell units arranged in an array form, each of the memory cell units having
a memory cell column having N rewritable nonvolatile memory cells connected in series with each other,
a bit line side select gate connected in series between the memory cell column and a bit line, and
a source-side select gate connected in series between the memory cell column and a source line,
the memory core further includes
means for selecting a word line of the memory cell array,
means for selecting a bit line of the memory cell array, and
a circuit with latch function which is connected to the bit lines of the memory cell array, and
the interface circuit loads the command latch enable, address latch enable and write enable signals as logic data "1" or "0", as it does the data, into input buffers provided in the nonvolatile semiconductor storage device in synchronism with the clock signal.

15. The nonvolatile semiconductor storage device of claim 14, wherein
the interface circuit comprises a plurality of first input latches for the input buffers, and
the interface circuit temporarily holds the command latch enable, address latch enable and write enable signals as logic data "1" or "0" in synchronism with the clock signal.

16. The nonvolatile semiconductor storage device of claim 15 comprising:
a plurality of first selection/holding circuits adapted to select and hold the command latch enable, address latch enable and write enable signals, latched by the first input latch, for a plurality of clocks of the clock signal and output the signals in a parallel manner after classifying the signals into a plurality of signal groups; and
a second selection/holding circuit adapted to select and hold data, latched by the second input latch, for a plurality of clocks of the clock signal and output the data in a parallel manner after classifying the data into a plurality of signal groups.

17. The nonvolatile semiconductor storage device of claim 16, wherein
the interface circuit comprises a clock input buffer adapted to be activated by the chip enable signal and load the clock signal, and
the first and second input latches latch an associated signal in synchronism with the clock signal temporarily loaded into the clock input buffer.

18. The semiconductor storage device of claim 17 comprising:
an n-bit counter capable of counting the clock signal held by the clock input buffer for n bits of the data; wherein
the first and second selection/holding circuits select and hold the command latch enable, address latch enable and write enable signals and the data for a plurality of clocks of the clock signal based on a count value of the n-bit counter and in synchronism with the clock signal held by the clock input buffer, and
the first and second selection/holding circuits output the signals and the data in a parallel manner after classifying the signal and the data into a plurality of signal groups.

19. The semiconductor storage device of claim 18 comprising:
a multi-port command decoder adapted to receive a plurality of sets of output values from the first and second selection/holding circuits and determine the operation of and input data to the memory core.

20. The nonvolatile semiconductor storage device of claim 15, wherein
the interface circuit comprises a clock input buffer adapted to be activated by the chip enable signal and load the clock signal, and
the first and second input latches latch an associated signal in synchronism with the clock signal temporarily loaded into the clock input buffer.

21. A rewritable nonvolatile semiconductor storage device comprising:
an interface circuit operable to receive a chip enable signal adapted to select the nonvolatile semiconductor storage device, a clock signal adapted to control the I/O operation timing of the nonvolatile semiconductor storage device, and at least one control signal adapted to load a command or write data into the nonvolatile semiconductor storage device, the interface circuit operable to load the at least one control signal in synchronism with the clock signal, as a plurality of sets of logic data of "1" or "0", into the nonvolatile semiconductor storage device; and
a decoder operable to decode the plurality of sets of logic data and determine, based on the decoding result, the operation of and input data to the nonvolatile semiconductor storage device.

22. The semiconductor storage device of claim 21, wherein
the control signal is at least one of a command latch enable signal adapted to load a command into the nonvolatile semiconductor storage device, an address latch enable signal adapted to load an address and a write enable signal adapted to load data.

23. The nonvolatile semiconductor storage device of claim 21, wherein
the number of sets of logic data of "1" or "0" making up the control signal loaded into the nonvolatile semiconductor storage device in synchronism with the clock signal is equal to two raised to a power.

24. The nonvolatile semiconductor storage device of claim 21, wherein
the control signal is at least one of a command latch enable signal adapted to load a command into the nonvolatile semiconductor storage device, an address latch enable signal adapted to load an address and a write enable signal adapted to load data,
the interface circuit sequentially receives command data and write data concurrently and in parallel with the control signal in synchronism with the clock signal so that the command data and write data are loaded into the nonvolatile semiconductor storage device as logic data of "1" or "0", and
the decoder decodes logic data, the number of whose sets is equal to two raised to a power and determines the operation of and input data to the nonvolatile semiconductor storage device based on the value result from decoding.

* * * * *